(12) United States Patent
Hung

(10) Patent No.: US 11,095,056 B2
(45) Date of Patent: Aug. 17, 2021

(54) ELECTRICAL CONNECTOR WITH REDUCE DISTANCE BETWEEN ELECTRICAL TERMINALS

(71) Applicant: Dongguan Luxshare Technologies Co., Ltd, Dongguan (CN)

(72) Inventor: Yung-Chih Hung, Dongguan (CN)

(73) Assignee: DONGGUAN LUXSHARE TECHNOLOGIES CO., LTD., Dongguan (CN)

( * ) Notice: Subject to any disclaimer, the term of this patent is extended or adjusted under 35 U.S.C. 154(b) by 0 days.

(21) Appl. No.: 16/864,520

(22) Filed: May 1, 2020

(65) Prior Publication Data
US 2020/0259278 A1 Aug. 13, 2020

(30) Foreign Application Priority Data
Nov. 4, 2019 (TW) .................................. 108139985

(51) Int. Cl.
*H01R 12/58* (2011.01)
*H05K 3/30* (2006.01)
(Continued)

(52) U.S. Cl.
CPC ......... *H01R 12/58* (2013.01); *H01R 12/7005* (2013.01); *H01R 13/26* (2013.01);
(Continued)

(58) Field of Classification Search
CPC .... H01R 12/58; H01R 12/7005; H01R 13/26; H01R 13/502; H01R 13/629; H05K 3/301; H05K 3/308; H05K 2201/10189
(Continued)

(56) References Cited

U.S. PATENT DOCUMENTS

| 4,464,832 A * | 8/1984 | Asick ..................... H05K 3/202 |
| | | 29/839 |
| 4,845,589 A * | 7/1989 | Weidler ............... H01R 25/162 |
| | | 361/614 |

(Continued)

FOREIGN PATENT DOCUMENTS

| CN | 1682414 B | 5/2010 |
| CN | 203747183 U | 7/2014 |

(Continued)

*Primary Examiner* — Peter G Leigh
(74) *Attorney, Agent, or Firm* — Birch, Stewart, Kolasch & Birch, LLP

(57) ABSTRACT

An electrical connector includes a seat and two electrical terminals. The two electrical terminals are disposed within the seat. Each electrical terminal includes a terminal body and a mounting portion. Each terminal body includes a front end, a rear end, and two lateral edges opposite to each other. The two lateral edges are connected to the front end and the rear end. The mounting portion is extending from the rear end. The terminal body further includes one or more bending wings formed on one of the two lateral edges. The bending wing is located on an inner side of the terminal body. The inner sides of the terminal bodies face each other, and the terminal bodies of the two electrical terminals are arranged in parallel, and the mounting portions of the electrical terminals are located at different heights so as to be arranged in misalignment.

15 Claims, 14 Drawing Sheets

(51) Int. Cl.
*H01R 12/70* (2011.01)
*H01R 13/502* (2006.01)
*H01R 13/629* (2006.01)
*H01R 13/26* (2006.01)

(52) U.S. Cl.
CPC ......... *H01R 13/502* (2013.01); *H01R 13/629* (2013.01); *H05K 3/301* (2013.01); *H05K 3/308* (2013.01); *H05K 2201/10189* (2013.01)

(58) Field of Classification Search
USPC ........................................................ 439/626
See application file for complete search history.

(56) References Cited

U.S. PATENT DOCUMENTS

| | | | |
|---|---|---|---|
| 5,024,610 A | 6/1991 | French et al. | |
| 5,431,576 A * | 7/1995 | Matthews | H01R 13/113 439/247 |
| 6,210,240 B1 * | 4/2001 | Comerci | H01R 12/7088 439/853 |
| 6,319,075 B1 * | 11/2001 | Clark | H01R 13/11 439/65 |
| 6,394,818 B1 * | 5/2002 | Smalley, Jr. | H01R 12/727 439/181 |
| 6,821,164 B2 * | 11/2004 | Mills | H01R 13/11 439/825 |
| 6,869,294 B2 * | 3/2005 | Clark | H01R 13/11 439/682 |
| 7,581,972 B2 * | 9/2009 | Daamen | H01R 13/6315 439/249 |
| 7,744,408 B2 | 6/2010 | Komatsu | |
| 7,976,317 B2 * | 7/2011 | Patel | H01R 12/7088 439/79 |
| 8,323,049 B2 | 12/2012 | Ngo | |
| 8,388,389 B2 * | 3/2013 | Costello | H01R 13/18 439/839 |
| 8,602,796 B2 * | 12/2013 | Chin | H01R 13/055 439/79 |
| 8,662,923 B2 * | 3/2014 | Wu | H01R 12/58 439/595 |
| 8,727,796 B2 * | 5/2014 | Ngo | H01R 12/75 439/79 |
| 8,834,190 B2 * | 9/2014 | Ngo | H01R 12/7023 439/328 |
| 9,054,456 B2 * | 6/2015 | Orris | H01R 13/112 |
| 9,130,287 B2 * | 9/2015 | Tai | H01R 13/112 |
| 9,136,652 B2 * | 9/2015 | Ngo | H01R 13/514 |
| 9,257,804 B1 * | 2/2016 | Beck | H01R 25/142 |
| 9,595,962 B1 * | 3/2017 | Beck | H01R 13/7032 |
| 9,627,790 B2 * | 4/2017 | Anderson | H01R 13/115 |
| 9,680,236 B2 * | 6/2017 | Ngo | H01R 13/113 |
| 9,711,897 B2 * | 7/2017 | Ho | H01R 13/113 |
| 9,871,309 B2 * | 1/2018 | Gao | H01R 13/11 |
| 10,020,622 B2 * | 7/2018 | Ebisawa | H01R 25/162 |
| 10,050,395 B2 * | 8/2018 | Ngo | H01R 25/162 |
| 2015/0364878 A1 * | 12/2015 | Orris | H01R 12/7088 439/55 |
| 2019/0089081 A1 * | 3/2019 | Zhang | H01R 13/24 |
| 2019/0288450 A1 * | 9/2019 | Brungard | H01R 13/502 |

FOREIGN PATENT DOCUMENTS

| | | |
|---|---|---|
| CN | 102301537 B | 8/2014 |
| CN | 206283014 U | 6/2017 |
| CN | 206283046 U | 6/2017 |
| CN | 206806561 U | 12/2017 |
| CN | 206908021 U | 1/2018 |
| CN | 207199840 U | 4/2018 |
| CN | 207265268 U | 4/2018 |
| TW | I464980 B | 12/2014 |
| TW | M565420 U | 8/2018 |

* cited by examiner

ELECTRICAL CONNECTOR WITH REDUCE DISTANCE BETWEEN ELECTRICAL TERMINALS

CROSS-REFERENCE TO RELATED APPLICATION

This non-provisional application claims priority under 35 U.S.C. § 119(a) to Patent Application No. 108139985 in Taiwan, R.O.C. on Nov. 4, 2019, the entire contents of which are hereby incorporated by reference.

BACKGROUND

Technical Field

This disclosure relates to an electrical connector, in particular, to an electrical connector with reduced distances between electrical terminals.

Related Art

An electrical connector, for example a connector on a circuit board for power or signal transmissions, generally includes an electrical-insulated base and plural electrical terminals. The electrical terminals are provided for contacting external terminals. Depending on different types of external terminals, the electrical terminals will have different forms as well.

An electrical terminal used for power transmission is usually configured as a plate-shape structure, thereby increasing the contact area between the electrical terminal of the electrical connector and the external terminal so as to be adopted for large-current transmission. That is, besides the external terminals being configured as plate-shape structures and aligned densely in parallel, the terminal bodies of the electrical terminals of the electrical connector are also configured as plate-shapes and aligned densely.

However, besides the terminal body being of plate-shaped, the electrical terminal further includes a mounting portion, a bending wing, or other structures with certain thickness of width. When adjacent electrical terminals are aligned densely, the mounting portions or the bending wings of the electrical terminals may possibly interfere with each other. As a result, the allowed minimum distance between two adjacent electrical terminals is restricted by the existence of the mounting portion or the bending wing, and the allowed minimum distance between two adjacent electrical terminals cannot be reduced easily.

SUMMARY

In order to further reduce the distance between two adjacent electrical terminals of the electrical connector, this disclosure discloses an electrical connector, the distance between two adjacent electrical terminals of the electrical connector is effectively reduced, and the electrical connector can be installed easily.

An electrical connector according to one embodiment of this disclosure comprises a seat and two electrical terminals. The two electrical terminals are disposed within the seat. Each of the electrical terminals includes a terminal body and a mounting portion. The terminal body includes a front end, a rear end, and two lateral edges opposite to each other. The two lateral edges are connected to the front end and the rear end. The mounting portion is extending from the rear end. The terminal body further includes at least one bending wing formed on one of the two lateral edges. The at least one bending wing is located on an inner side of the terminal body.

The inner sides of the terminal bodies face each other, and the terminal bodies of the two electrical terminals are arranged in parallel to an altitude direction. In the altitude direction, the terminal bodies of the electrical terminals are arranged in parallel, and the mounting portions of the electrical terminals are located at different heights so as to be arranged in misalignment.

In at least one embodiment, for each of the electrical terminal, the mounting portion is shifted from a central axis of the terminal body, so that the mounting portion is close to one of the two lateral edges and away from the other lateral edge in the altitude direction.

In at least one embodiment, for the two terminal bodies, the two mounting portions are respectively shifted toward different directions from central axes of the terminal bodies.

In at least one embodiment, the at least one bending wing is perpendicular to the corresponding terminal body.

In at least one embodiment, the two terminal bodies are located at different positions in the altitude direction so as to be arranged in misalignment, and the bending wings of the two terminal bodies are located at different heights in the altitude direction arranged in misalignment.

In at least one embodiment, the seat includes a front surface and a rear surface. At least one installation trough is formed on the rear surface, and the at least one installation trough communicates with the front surface through two insertion holes. The terminal body of each of the electrical terminals is inserted into the corresponding insertion hole, and the mounting portions of the electrical terminals are located in the at least one installation trough.

In at least one embodiment, the electrical terminal further includes a contact portion extending from the front end, and inserted into the corresponding insertion hole.

In at least one embodiment, the contact portion of each of the electrical terminals includes at least one first clamping piece and at least one second clamping piece, the at least one first clamping piece and the at least one second clamping piece are opposite to each other, and a front end of the at least one first clamping piece and a front end of the at least one second clamping piece respectively include guiding bevels inclined outwardly.

In at least one embodiment, each of the insertion holes includes a fixing section and an open section, the fixing section communicates with to the at least one installation trough, the open section communicates with the front surface, the terminal body is located in the fixing section, and the contact portion is located in the open section.

In at least one embodiment, wherein the fixing section of each of the insertion holes includes a first wall surface and a second wall surface opposite to each other, at least one guiding groove is formed on the first wall surface of each of the insertion holes for being embedded with the at least one bending wing of the terminal body, so that the terminal body abuts against the second wall surface.

In at least one embodiment, a stepped segment is formed between the open section and the fixing section of each of the insertion holes.

In at least one embodiment, the two insertion holes are at different heights in the altitude direction so as to be arranged in misalignment.

In at least one embodiment, the first wall surface and the second wall surface of each of the insertion holes are arranged in parallel to the altitude direction, the second wall surfaces of the two insertion holes are away from each other, and the first wall surfaces of the two insertion holes are adjacent to each other.

In at least one embodiment, the guiding grooves of the two insertion holes are located at different heights so as to be arranged in misalignment.

In at least one embodiment, the at least one bending wing includes a notch, one side of the notch corresponding to the front end is closed; the seat further includes two pin holes intersected with and in communication with each of the insertion holes; a position of each of the pin holes communicating with the corresponding insertion hole corresponds to a position of the corresponding notch.

In at least one embodiment, the electrical connector further includes two fixing pins for being inserted into the pin holes to pass through the notches.

In one or more embodiments of this disclosure, the edge of the electrical terminal forms the bending wing for facilitating the fixation of the electrical terminal when the electrical terminal is installed to the seat of the electrical connector. Moreover, in each pair of the electrical terminals, the mounting portions are arranged in misalignment. Hence, when the mounting portions of paired electrical terminals come close to each other, the interference between the mounting portions can be prevented, thereby effectively reducing the distance between two adjacent electrical terminals. In one or more embodiments of this disclosure, the terminal bodies as well as the bending wings are arranged in misalignment, so that the distance between the two terminal bodies can be further reduced.

BRIEF DESCRIPTION OF THE DRAWINGS

This disclosure will become more fully understood from the detailed description given herein below for illustration only, and thus not limitative of this disclosure, wherein.

DETAILED DESCRIPTION

Figure 1:
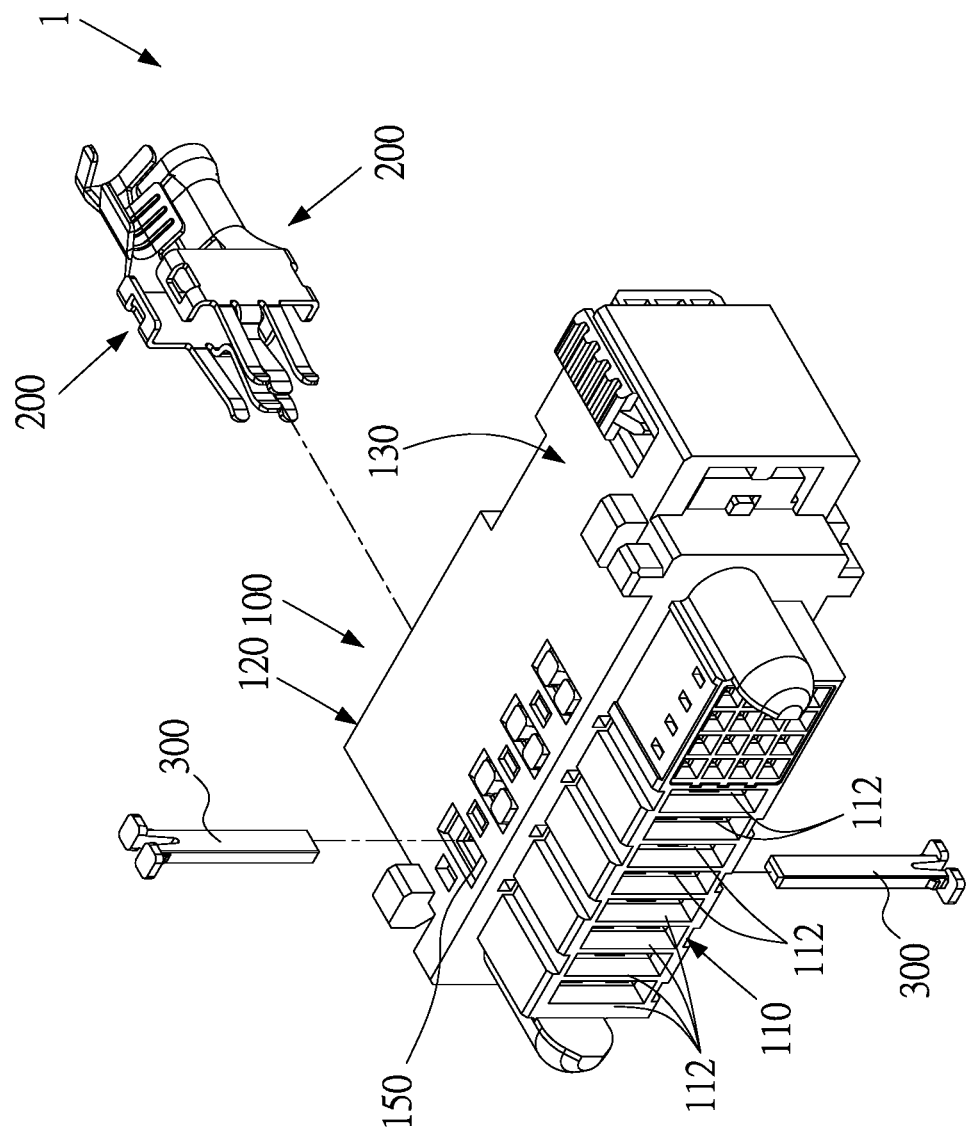
FIG. 1 illustrates an exploded view of an electrical connector according to a first embodiment of this disclosure.
Figure 2:
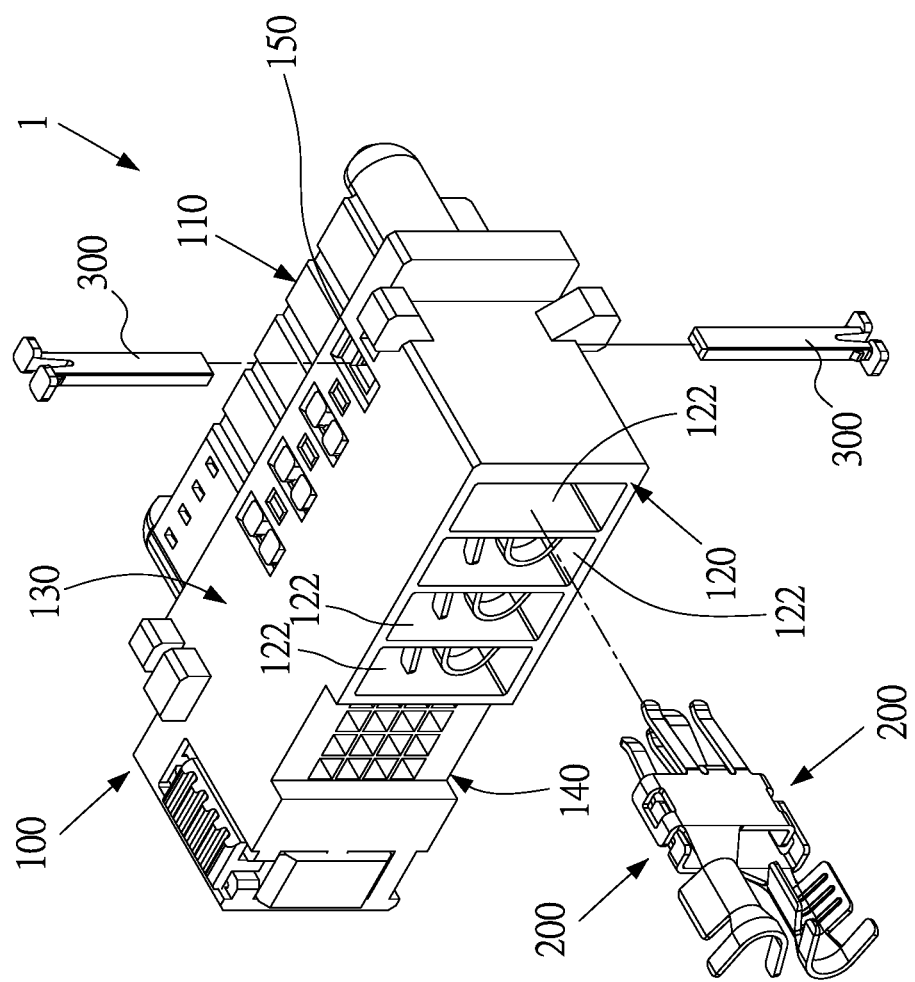
FIG. 2 illustrates another exploded view of the electrical connector of the first embodiment.
Figure 3:
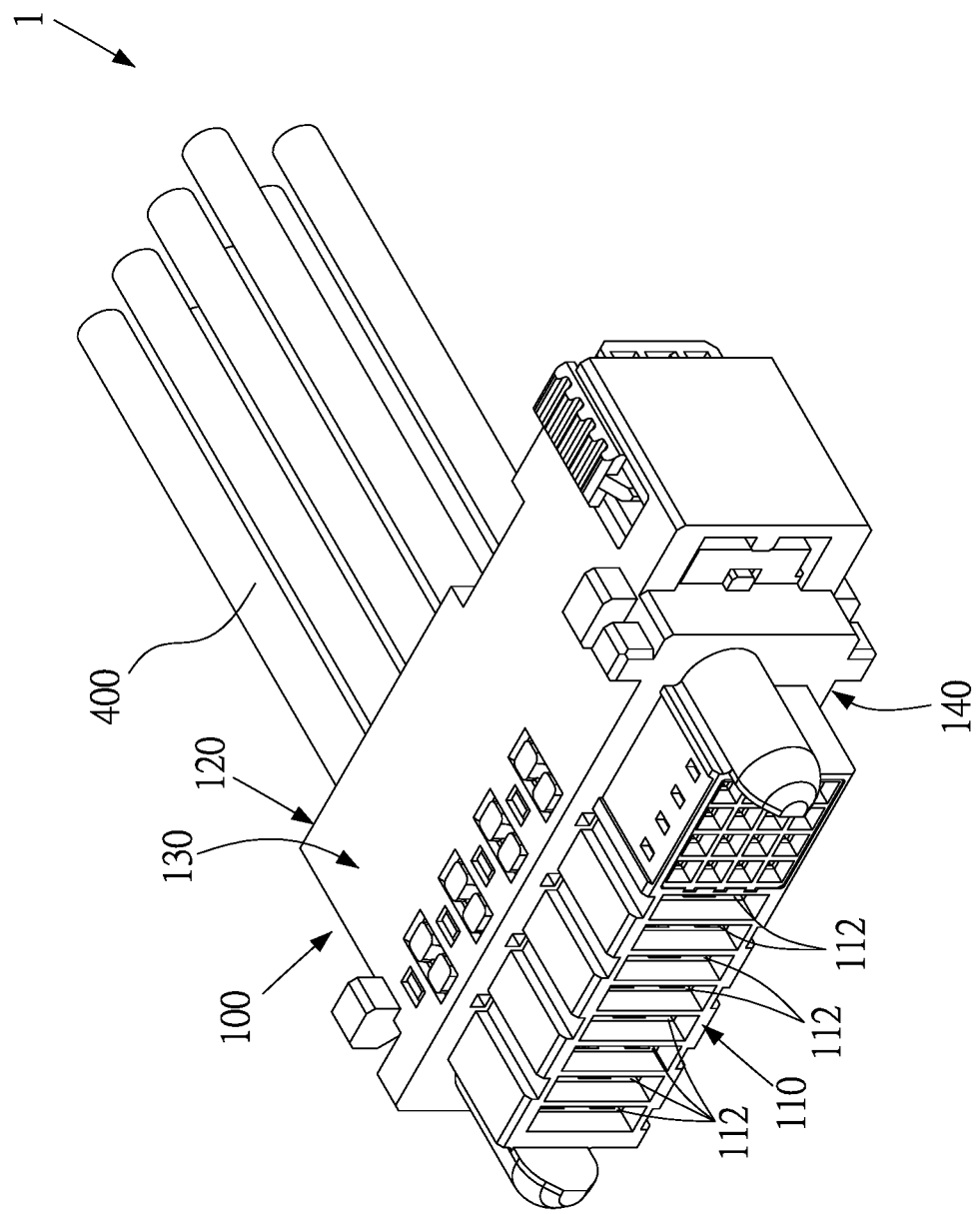
FIG. 3 illustrates a perspective view of the electrical connector of the first embodiment.

Please refer to FIG. 1, FIG. 2, and FIG. 3; an electrical connector 1 according to a first embodiment of this disclosure is illustrated. The electrical connector 1 comprises a seat 100 and two electrical terminals 200.

As shown in FIG. 1, FIG. 2, and FIG. 3, the seat 100 includes a front surface 110, a rear surface 120, a top surface 130, and a bottom surface 140. The front surface 110 and the rear surface 120 are opposite to each other. The top surface 130 and the bottom surface 140 are opposite to each other, and the top surface 130 and the bottom surface 140 are connected to the front surface 110 and the rear surface 120. Plural installation troughs 122 are formed on the rear surface 120, and each of the installation troughs 122 communicates with the front surface 110 through two insertion holes 112.

As shown in FIG. 1, FIG. 2, and FIG. 3, the two electrical terminals 200 are disposed in the installation trough 122 and respectively inserted into the insertion holes 122. Hence, the electrical terminals 200 are adapted to contact an external terminal 500 inserted into the insertion holes 112.

Figure 4:
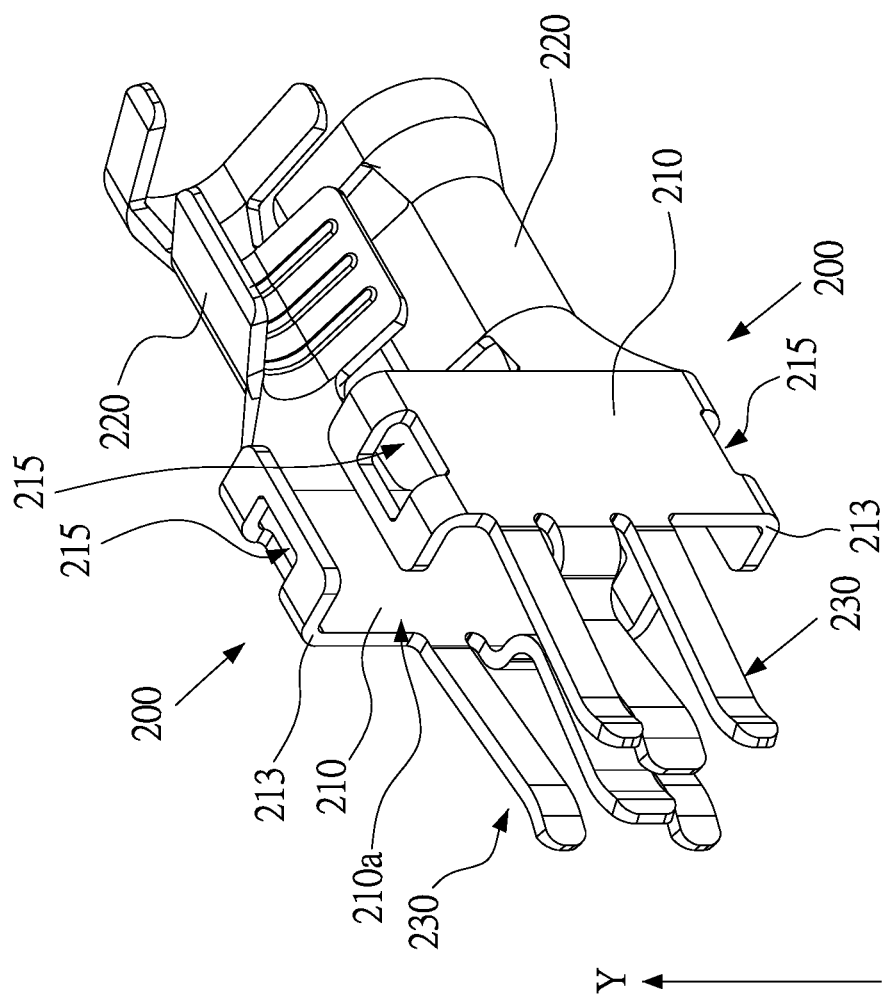
FIG. 4 illustrates a perspective view of two electrical terminals of the first embodiment.
Figure 5:
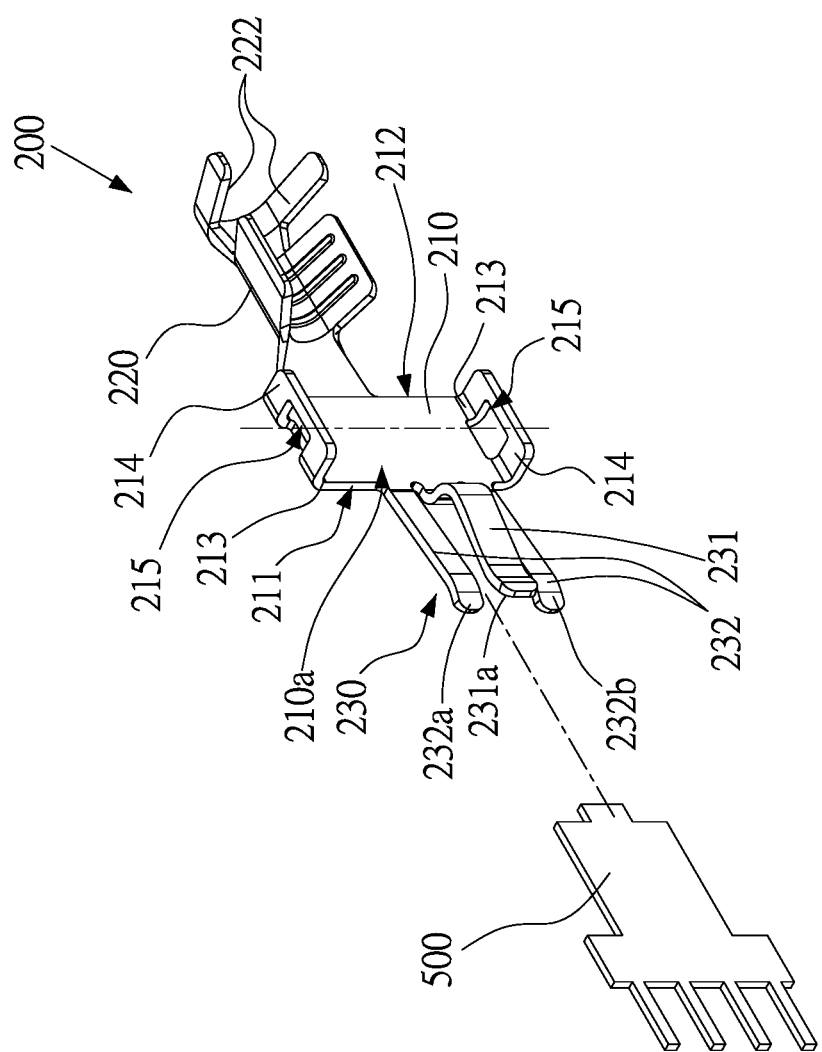
FIG. 5 illustrates an exploded view showing one electrical terminal of the first embodiment and one external terminal.
Figure 6:
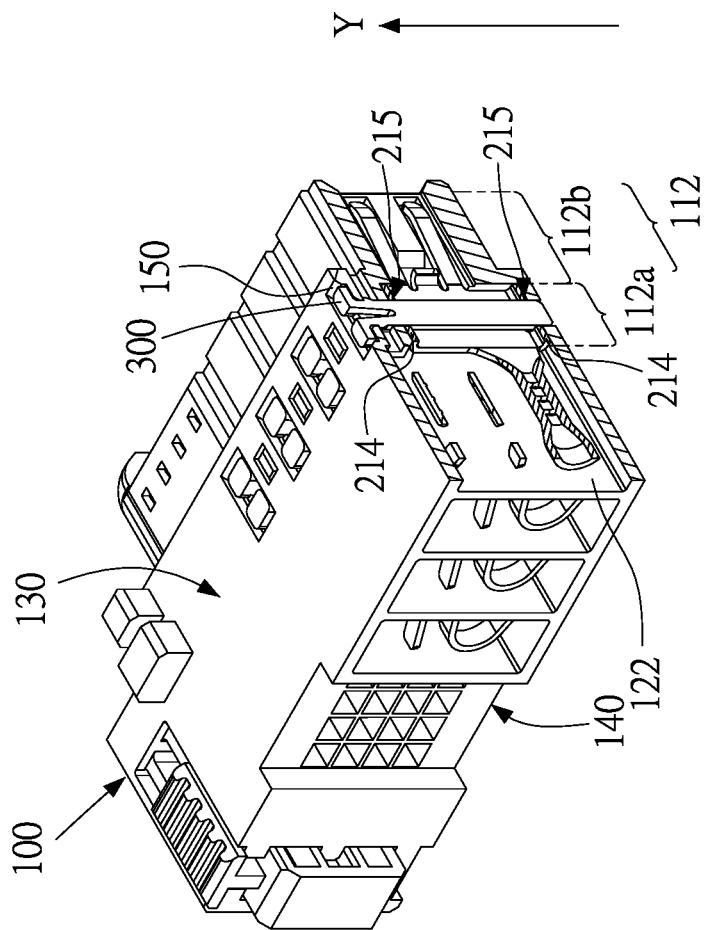
FIG. 6 illustrates a partial perspective sectional view of the electrical connector of the first embodiment.

As shown in FIG. 4, FIG. 5, and FIG. 6, each of the electrical terminals 200 includes a terminal body 210, a mounting portion 220, and a contact portion 230. The terminal body 210 is inserted into the insertion hole 112, and the mounting portion 220 is disposed in the installation trough 122. The terminal body 210 includes a front end 211, a rear end 212, and two lateral edges 213. The front end 211 and the rear end 212 are opposite to each other. The two lateral edges 213 are opposite to each other and connected to the front end 211 and the rear end 212. The terminal body 210 further includes two bending wings 214 respectively formed on the two lateral edges 213. The two bending wings 214 are located on an inner side 210a of the terminal body 210. The terminal body 210 is plate-shaped, and the two bending wings 214 are substantially perpendicular to the terminal body 210. In the first embodiment, each of the installation troughs 122 is provided with two electrical terminals 200. The terminal bodies 210 of the two electrical terminals 200 are respectively inserted into the insertion holes 112, so that plural pairs of electrical terminals 200 are disposed in the seat 100.

As shown in FIG. 3, FIG. 5, and FIG. 6, the mounting portion 220 is extending from the rear end 212 and located in the installation trough 122. The mounting portion 220 is adapted to connect to a wire 400. The mounting portion 220 is provided with a mounting member 222, such as a bent clamping sheet, for fixing the mounting portion 220 on the wire 400, thereby strengthening the connection between the mounting portion 220 and the wire 400.

As shown in FIG. 4, FIG. 5, and FIG. 6, the contact portion 230 is extending from the front end 211 and inserted into the insertion hole 112. The contact portion 230 is adapted to contact the external terminal 500 inserted into the electrical connector 1 from outside. Therefore, the electrical connection between the external terminal 500 and the electrical terminal 200 can be achieved. The contact portion 230 may be a plate-shaped member, or even may be a portion of the terminal body 210.

Figure 7:
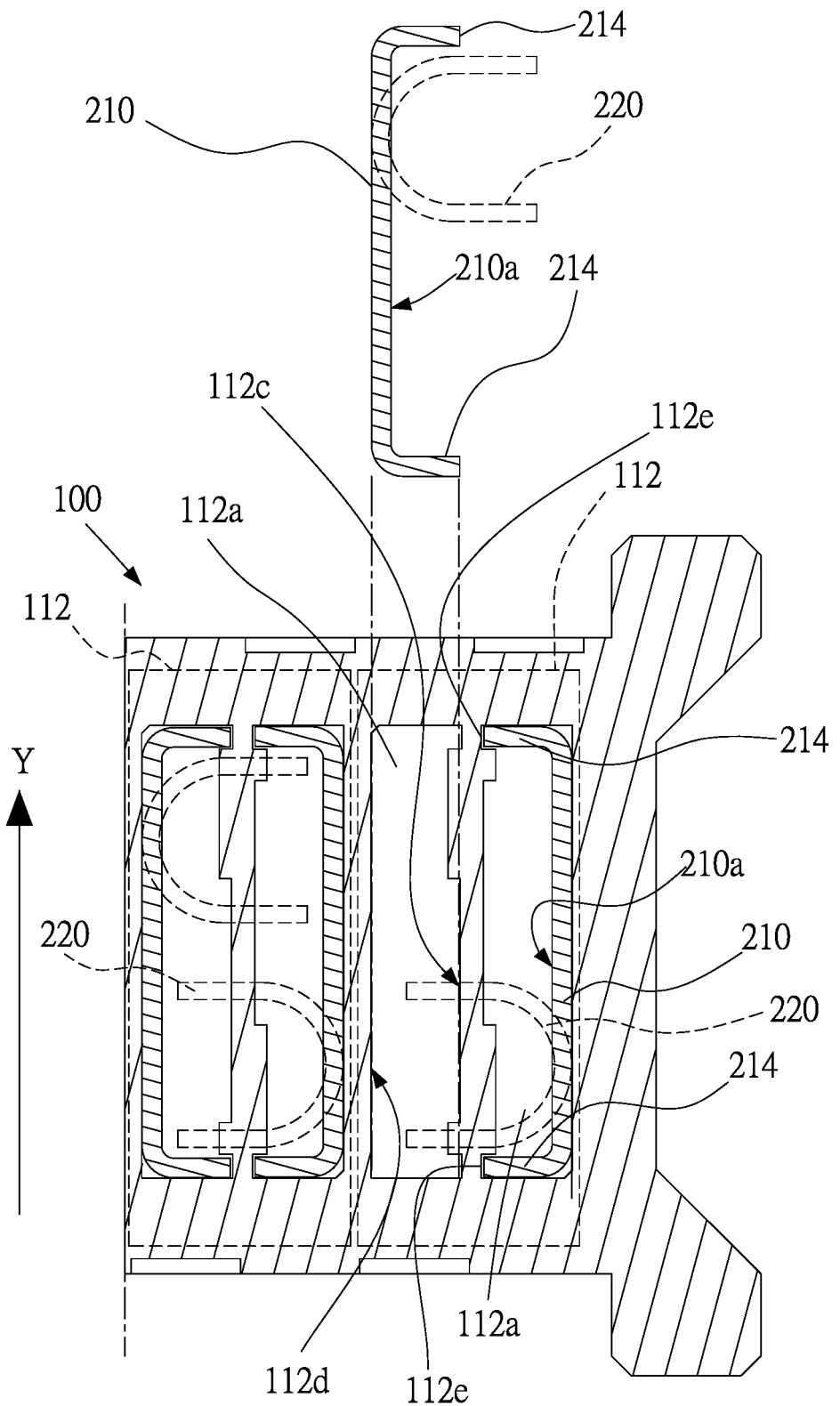
FIG. 7 illustrates a partial cross-sectional view of the electrical connector of the first embodiment.

As shown in FIG. 4, FIG. 6, and FIG. 7, an altitude direction Y is defined from the bottom surface 140 to the top surface 130, and the terminal bodies 210 of the two electrical terminals 200 are arranged in parallel in the altitude direction Y; that is, the terminal bodies 210 are arranged in parallel in the altitude direction Y. Hence, the mounting portions 220 of the electrical terminals 200 are substantially perpendicular to the altitude direction Y. Moreover, the inner sides 210a of the terminal bodies 210 face each other, and the bending wing 214 at one of the electrical terminals 200 extends toward the terminal body 210 of the other electrical terminal 200. Moreover, in the altitude direction Y, the mounting portions 220 are located at different heights so as to be arranged in misalignment. Because the mounting portions 220 are arranged in misalignment, the inner sides 210a of the terminal bodies 210 can be configured in a close manner without causing the interference between the mounting portions 220, thereby greatly reducing the distance between the terminal bodies 210. It is understood that, the altitude direction Y is used to define the orientation of the two terminal bodies 210, and is not limited to be the direction from the bottom surface 140 to the top surface 130. The altitude direction Y may be any direction perpendicular to the axial direction of the installation trough 122.

Figure 8:
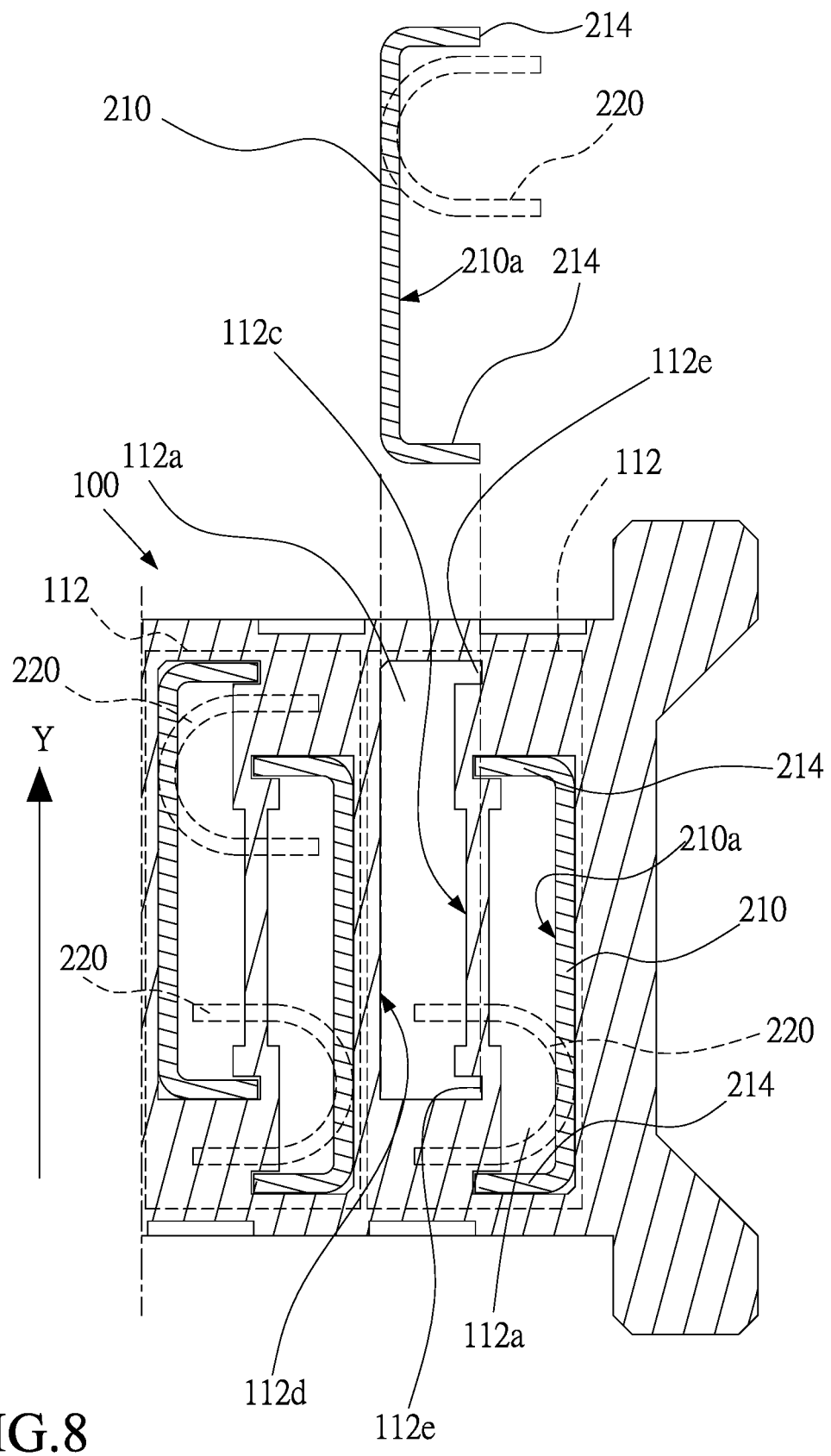
FIG. 8 illustrates a partial cross-sectional view of one variation implementation of the electrical connector of the first embodiment.

As shown in FIG. 4, FIG. 7, and FIG. 8, for the electrical terminal 200, the mounting portion 220 is shifted from a central axis of the terminal body 210, so that the mounting portion 220 is close to one of the two lateral edges 213 and away from the other lateral edge 213 in the altitude direction Y. Moreover, when the two terminal bodies 210 are arranged in parallel, the mounting portions 220 are respectively shifted from central axes of the terminal bodies 210 toward different directions. In other words, in this embodiment, in the electrical terminal 200 with a higher height in the altitude direction Y the mounting portion 220 is shifted from the central axis upwardly, and in the electrical terminal 200 with a lower height in the altitude direction Y the mounting portion 220 is shifted from the central axis downwardly. Accordingly, when the two terminal bodies 210 are close to each other, the mounting portion 220 can be arranged in misalignment and not to interfere with each other. In fact, as long as the configurations of the two electrical terminals 200 are the same and the mounting portions 220 are respectively shifted from the central axes of the terminal bodies 210, the mounting portions 220 of the two electrical terminals 200 are accordingly shifted upwardly or downwardly when the inner sides 210a face each other.

As shown in FIG. 6, FIG. 7, and FIG. 8, in the first embodiment, each of the installation troughs 122 communicates with the front surface 110 through two insertion holes 112. Hence, two external terminals 500 can be inserted into the insertion holes 112 from the front surface 110 and respectively contact the two electrical terminals 200. It is understood that, the seat 100 may include one installation trough 122 or may include several but less number of installation troughs 122. Under this configuration, the bottom of the installation trough 122 includes plural pairs of insertion holes 112 for respectively fixing with the electrical terminals 200 in pairs. For each pair of the electrical terminals 200, the mounting portions 220 are arranged in misalignment, so that the distance between the electrical terminals 200 can be reduced.

As shown in FIG. 6, FIG. 7, and FIG. 8, each of the insertion holes 112 includes a fixing section 112a and an open section 112b. The fixing portion 112a is connected to the installation trough 122, and the open section 112b communicates with the front surface 110. The fixing portion 112a includes a first wall surface 112c and a second wall surface 112d opposite to each other. The first wall surface 112c and the second wall surface 112d are arranged in parallel to the altitude direction Y, the second wall surfaces 112d of the two insertion holes 112 are away from each other, and the first wall surfaces 112c of the two insertion holes 112 are adjacent to each other. Two first guiding grooves 112e are formed on the first wall surface 112c. The guiding grooves 112e are provided for being embedded with the edges of the bending wings 214, so that the terminal body 210 abuts against the second wall surface 112d of the fixing section 112a. Therefore, the terminal body 210 can be fixed, and the orientation for inserting the terminal body 210 into the insertion hole 112 can be limited to make the contact portion 230 located in the open section 112b. Hence, the mating between the guiding groove 112e and the bending wing 214 provide a foolproof fixation function for the terminal body 210 when the electrical terminal 200 is installed to the seat 100. Moreover, in one embodiment, a stepped segment is formed between the open section 112b and the fixing section 112a so as to block the front end 211 of the terminal body 210. Therefore, under this configuration, the terminal body 210 cannot enter into the open section 112b and detach from the front surface 110 of the seat 100.

As shown in FIG. 7 and FIG. 8, in the altitude direction Y, the terminal bodies 210 of the two electrical terminals 200 may be located at a same height or may be located at different heights and arranged in misalignment. As shown in FIG. 7, in this embodiment, when the terminal bodies 210 of the two electrical terminals 200 are located at a same height and when the bending wings 214 of the two electrical terminals 200 are also located at a same height, the lengths of the bending wings 214 in a direction perpendicular to the altitude direction Y would have to be reduced properly for preventing the bending wings 214 from being interfered with each other when the terminal bodies 210 are aligned in a close manner. As shown in FIG. 8, when the terminal bodies 210 of the two electrical terminals 200 are located at different heights and arranged in misalignment and when the bending wings 214 of the two electrical terminals are also located at different heights and arranged in misalignment, the projections of the bending wings 214 of the two electrical terminals 200 in the altitude direction Y may be overlapped with each other. Hence, the two terminal bodies 210 can be aligned closely as much as possible.

As shown in FIG. 8, to allow the two terminal bodies 210 to be arranged in misalignment, the two insertion holes 112 are located at different heights in the altitude direction Y and arranged in misalignment. Under this arrangement, the guiding grooves 112e of the two insertion holes 112 are located at different heights and arranged in misalignment; furthermore, the projections of the guiding grooves 112e in the altitude direction Y may be partially or completely overlapped with each other. Hence, when the electrical terminals 200 are installed in the installation trough 122 with the terminal bodies 210 and the contact portions 230 being respectively inserted into the insertion holes 112, the terminal bodies 210 are arranged in misalignment in the altitude direction Y, and the bending wings 214 of the electrical terminals 200 are not interfered with each other, thereby reducing the distance between the terminal bodies 210.

As shown in FIG. 4, FIG. 5, and FIG. 6, the bending wing 214 includes a notch 215. In the first embodiment, the notch 215 is a hole defined through the bending wing 214, and the notch 215 may be partially extending to terminal body 210. Moreover, the projections of the notches 215 of the two bending wings 214 are substantially overlapped with each other.

As shown in FIG. 1, FIG. 2, and FIG. 6, the seat 100 further includes pin holes 150 on the top surface 130 or the bottom surface 140 of the seat 100. Each of the pin holes 150 is intersected with and in communication with on the fixing section 112a of one of the insertion holes 112. A position of the pin hole 150 communicating with the fixing section 112a of the corresponding insertion hole 112 corresponds to a position of the notch 215. The electrical connector 1 further includes a fixing pin 300 adapted to be inserted into the pin hole 1500 to pass through the notch 215 and to fix the bending wing 214. Hence, the electrical terminal 200 can be fixed in the seat 100. The number of the pin hole 150 and the number of the fixing pin 300 correspond to the number of the electrical terminal 200. Accordingly, each of the electrical terminals 200 can be fixed in the seat 100 by the corresponding fixing pin 300.

Figure 9:
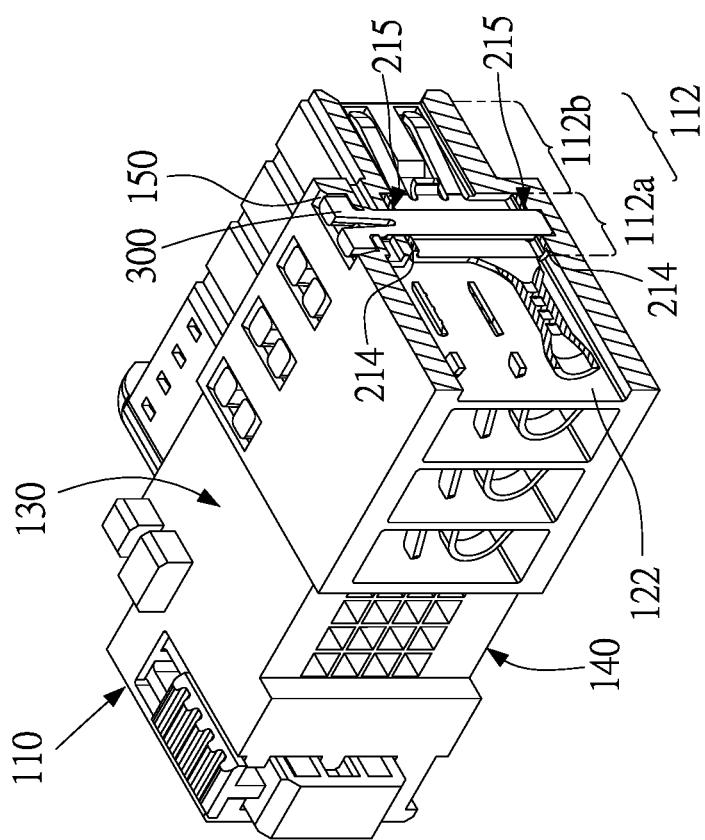
FIG. 9 illustrates another partial perspective sectional view of the electrical connector of the first embodiment.

As shown in FIG. 6 and FIG. 9, the pin hole 150 is not necessarily defined through the top surface 130 and the bottom surface 140 of the seat 100. In FIG. 7, the pin holes 150 are on the top surface 130 (bottom surface 140) of the seat 100 alternatively and intersected with and in communication with the corresponding fixing sections 112a, so as to extend toward the bottom surface 140 (the top surface 130). When the seat 100 has a thinner thickness, the pin hole 150 may be further defined through the bottom surface 140 (the top surface 130), so that the portion of the front end of the fixing pin 300 held into the seat 100 is longer. As shown in FIG. 9, when the seat 100 has a thicker thickness, the pin hole 150 is not required to be defined through the bottom surface 140 (the top surface 130), and the front end of the fixing pin 300 held into the seat 100 is still long enough.

As shown in FIG. 5, the configuration of the contact portion 230 corresponds to the configuration of the external terminal 500. Taking the first embodiment as an example, the external terminal 500 is an electrode plate, and the contact portion 230 is a clamping member having at least one first clamping piece 231 and at least one second clamping piece 232 opposite to each other. A front end of the first clamping piece 231 and a front end of the second clamping piece 232 respectively include guiding bevels 231a, 232a inclined outwardly. The guiding bevels 231a, 232a are adapted to guide the external terminal 500 to be inserted into a space between the at least one first clamping piece 231 and the at least one second clamping piece 232, so that the external terminal 500 is clamped by the at least one first clamping piece 231 and the at least one second clamping piece 232. The number of the first clamping piece 231 and the number of the second clamping piece 232 depend upon the width of the external terminal 500. For example, in the first embodiment, the contact portion 230 has one first clamping piece 231 and two second clamping pieces 232, and the second clamping pieces 232 and the first clamping piece 231 are alternately arranged on the contact portion 230. Hence, the contact portion 230 can apply the force to the external terminal 500 through the first clamping piece 231 and the second clamping pieces 232 uniformly, and the contact area between the electrical terminal 200 and the external terminal 500 increases.

Figure 10:
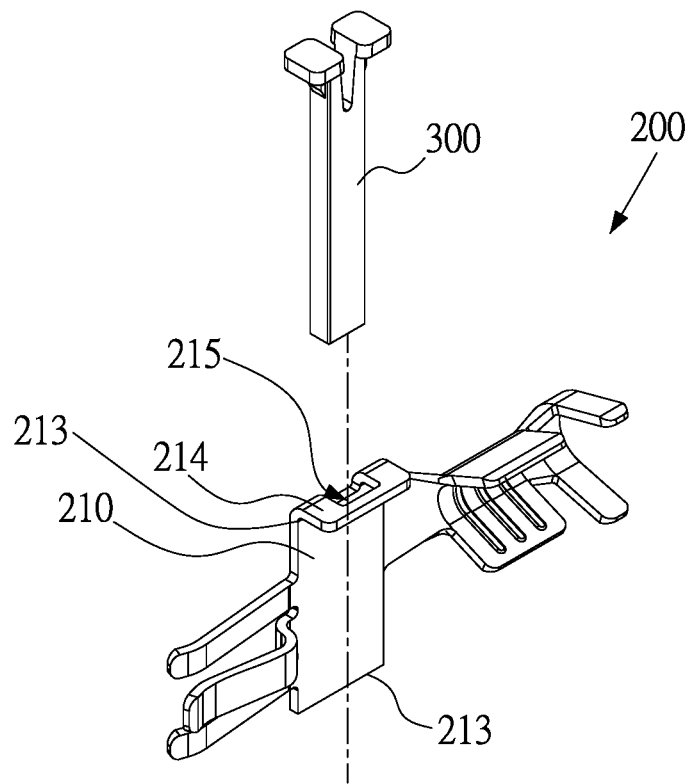
FIG. 10 illustrates a perspective view of an electrical terminal and a fixing pin of an electrical connector according to a second embodiment of this disclosure.

Please refer to FIG. 10; an electrical terminal 200 according to a second embodiment of this disclosure is illustrated. In the second embodiment, the terminal body 210 includes only one bending wing 214 formed on one of the opposite two lateral edges 213. In the second embodiment, the terminal body 210 is also a plate-shaped member, and the bending wing 214 is substantially perpendicular to the terminal body 210. The bending wing 214 includes a notch 215. In this embodiment, as the seat 100 shown in FIG. 6, each of the insertion holes 112 is provided with one guiding groove 112e. In other words, in this embodiment, the number of the guiding groove 112e matches the number of the bending wing 214. In each pair of electrical terminals 200, the mounting portions 220 are arranged in misalignment, and the bending wings 214 are arranged in misalignment.

Figure 11:
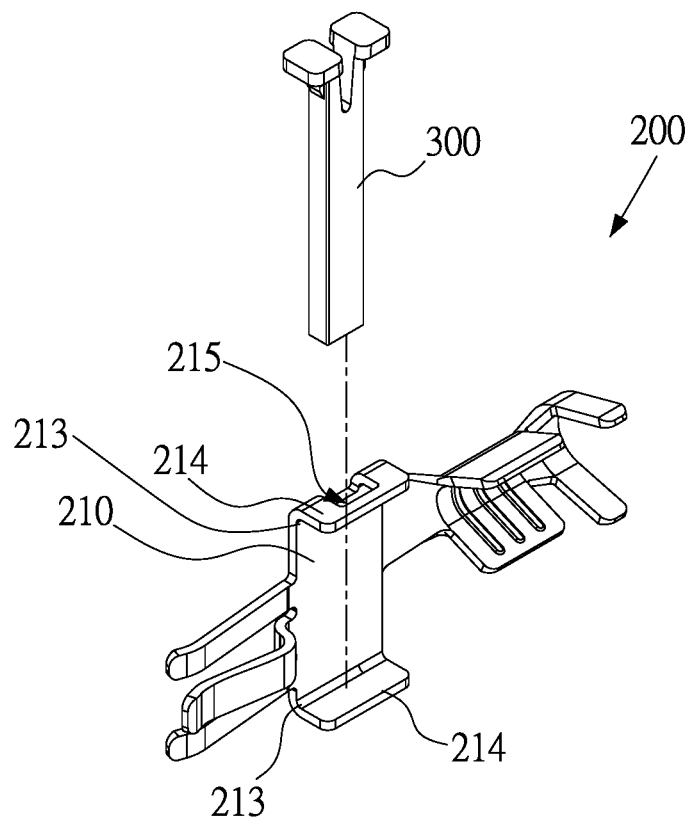
FIG. 11 illustrates a perspective view of an electrical terminal and a fixing pin of an electrical connector according to a third embodiment of this disclosure.
Figure 12:
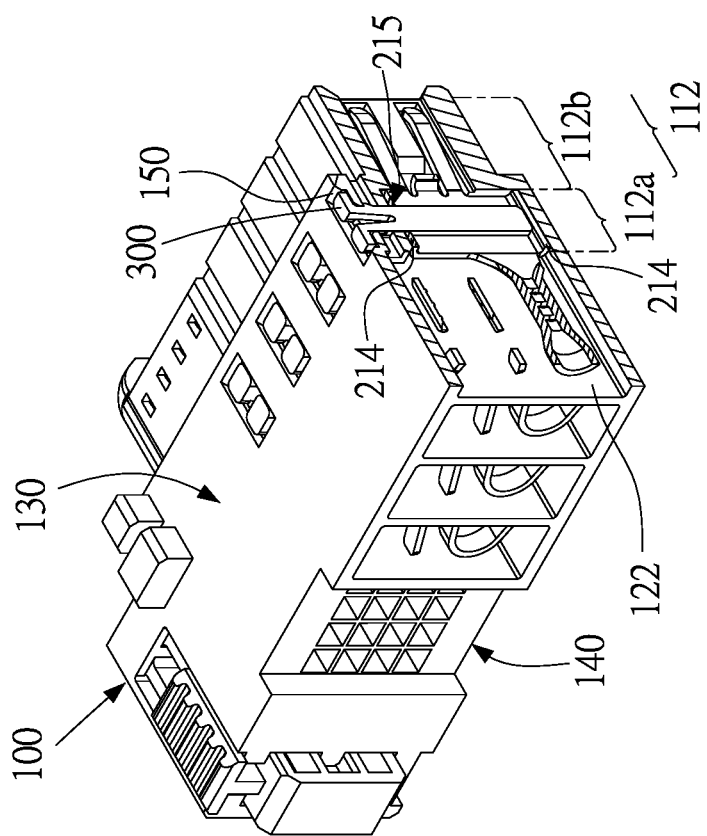
FIG. 12 illustrates a partial perspective sectional view of the electrical connector of the third embodiment.

Please refer to FIG. 11 and FIG. 12; an electrical terminal 200 according to a third embodiment of this disclosure is illustrated, and the electrical terminal 200 is applicable to the electrical connector 1. In the third embodiment, the terminal body 210 includes two bending wings 214 respectively formed on the two opposite lateral edges 213. In the third embodiment, the terminal body 210 is still a plate-shaped member, and the two bending wings 214 are substantially perpendicular to the terminal body 210, respectively. One of the two bending wings 214 is provided with one notch 215. Hence, as shown in FIG. 12, the length of the fixing pin 300 has to be shortened to prevent from being interfered by the bending wing 214 without a notch 215. Moreover, in this embodiment, the pin hole 150 does not have to be defined through with the bottom surface 140 (the top surface 130) to correspond to the bending wing 214 without a notch 215. Furthermore, the position of the bending wing 214 with the notch 215 has to be configured to correspond to the position of the fixing pin 300. Hence, after the fixing pin 300 is inserted into the pin hole 150, the fixing pin 300 can pass through the notch 215 directly. In each pair of the electrical terminals 200, the mounting portions 220 are arranged in misalignment, and the terminal bodies 210 and the bending wings 214 are arranged in misalignment, so that the two terminal bodies 210 can be arranged closely as much as possible.

Figure 13:
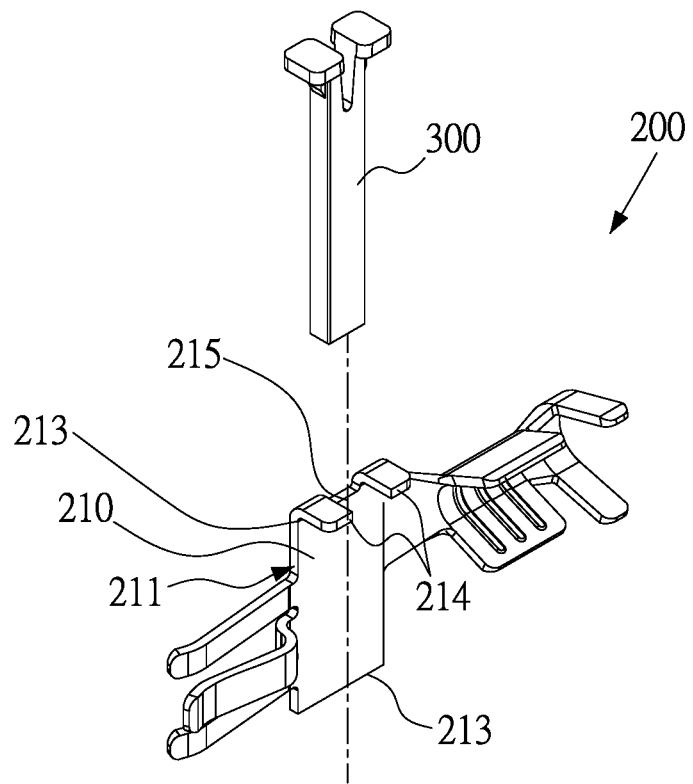
FIG. 13 illustrates a perspective view of an electrical terminal of an electrical connector according to a fourth embodiment of this disclosure.
Figure 14:
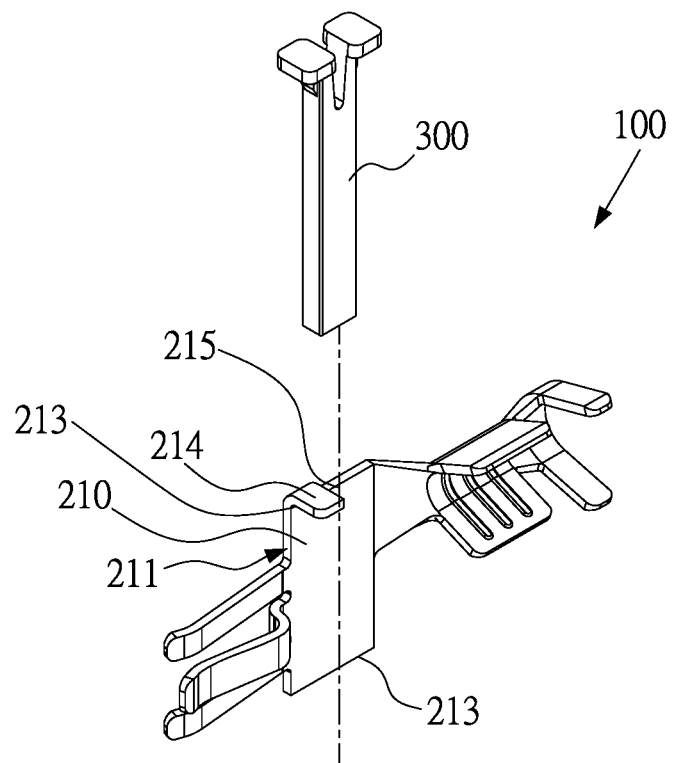
FIG. 14 illustrates another perspective view of the electrical terminal of the fourth embodiment.

Please refer to FIG. 13 and FIG. 14; an electrical terminal 200 according to a fourth embodiment of this disclosure is illustrated, and the electrical terminal 200 is applicable to the electrical connector 1. In the fourth embodiment, the notch 215 is not a hole and can have different configurations, as long as one end of the notch 215 corresponding to the front end 211 is closed to ensure that the fixing pin 300 can be stopped by the bending wing 214 such that the electrical terminal 200 does not move toward the rear surface 120 of the seat 100. Hence, as shown in FIG. 13, the notch 215 may be a missing corner formed on the edge of the bending wing 214; alternately, as shown in FIG. 14, one end of the notch 215 corresponding to the rear end 212 may be opened. In each pair of electrical terminals 200, the mounting portions 220 are arranged in misalignment, and the bending wings 214 are arranged in misalignment.

In one or more embodiments of this disclosure, the edge of the electrical terminal 200 forms the bending wing 214 for facilitating the fixation of the electrical terminal 200 when the electrical terminal 200 is installed to the seat 100 of the electrical connector 1. Moreover, in each pair of the electrical terminals 200, the mounting portions 220 are arranged in misalignment. Hence, when the mounting portions 220 of paired electrical terminals 200 come close to each other, the interference between the mounting portions 220 can be prevented, thereby effectively reducing the distance between two adjacent electrical terminals 200. In one or more embodiments of this disclosure, the terminal bodies 210 as well as the bending wings 214 are interleaved, so that the distance between the two terminal bodies 210 can be further reduced.

What is claimed is:
1. An electrical connector, comprising:
a seat including a front surface and a rear surface, at least one installation trough is formed on the rear surface, and the at least one installation trough communicates with the front surface through two insertion holes; and two electrical terminals, disposed within the seat; wherein each of the electrical terminals includes a terminal body and a mounting portion, the terminal body has a front end, a rear end, and two lateral edges opposite to each other, the two lateral edges are connected to the front end and the rear end, and the mounting portion is extending from the rear end; the terminal body further includes at least one bending wing formed on one of the two lateral edges, and the at least one bending wing is located on an inner side of the terminal body;

wherein the inner sides of the terminal bodies face each other, and the terminal bodies of the two electrical terminals are arranged in parallel to an altitude direction; in the altitude direction, the terminal bodies of the two electrical terminals are arranged in parallel, and the mounting portions of the two electrical terminals are located at different heights so as to be arranged in misalignment, and the terminal body of each of the electrical terminals is inserted into the corresponding insertion hole, and the mounting portions of the electrical terminals are located in the at least one installation trough.

2. The electrical connector as claimed in claim 1, wherein for each of the electrical terminals, the mounting portion is shifted from a central axis of the terminal body, so that the mounting portion is close to one of the two lateral edges and away from the other lateral edge in the altitude direction.

3. The electrical connector as claimed in claim 1, wherein for the two terminal bodies, the two mounting portions are respectively shifted toward different directions from central axes of the terminal bodies.

4. The electrical connector as claimed in claim 1, wherein the at least one bending wing is perpendicular to the corresponding terminal body.

5. The electrical connector as claimed in claim 1, wherein the two terminal bodies are located at different positions in the altitude direction so as to be arranged in misalignment, and the bending wings of the two terminal bodies are located at different heights in the altitude direction so as to be arranged in misalignment.

6. The electrical connector as claimed in claim 1, wherein each of the electrical terminals further includes a contact portion extending from the front end and inserted into the corresponding insertion hole.

7. The electrical connector as claimed in claim 6, wherein the contact portion of each of the electrical terminals includes at least one first clamping piece and at least one second clamping piece, the at least one first clamping piece and the at least one second clamping piece are opposite to each other, and a front end of the at least one first clamping piece and a front end of the at least one second clamping piece respectively include guiding bevels inclined outwardly.

8. The electrical connector as claimed in claim 6, wherein each of the insertion holes includes a fixing section and an open section, the fixing section communicates with to the at least one installation trough, the open section communicates with the front surface, the terminal body is located in the fixing section, and the contact portion is located in the open section.

9. The electrical connector as claimed in claim 8, wherein the fixing section of each of the insertion holes includes a first wall surface and a second wall surface opposite to each other, at least one guiding groove is formed on the first wall surface of each of the insertion holes for being embedded with the at least one bending wing of the terminal body, so that the terminal body abuts against the second wall surface.

10. The electrical connector as claimed in claim 9, wherein the two insertion holes are at different heights in the altitude direction arranged in misalignment.

11. The electrical connector as claimed in claim 9, wherein the first wall surface and the second wall surface of each of the insertion holes are arranged in parallel to the altitude direction, the second wall surfaces of the two insertion holes are away from each other, and the first wall surfaces of the two insertion holes are adjacent to each other.

12. The electrical connector as claimed in claim 9, wherein the guiding grooves of the two insertion holes are located at different heights so as to be arranged in misalignment.

13. The electrical connector as claimed in claim 8, wherein a stepped segment is formed between the open section and the fixing section of each of the insertion holes.

14. The electrical connector as claimed in claim 1, wherein the at least one bending wing includes a notch, one side of the notch corresponding to the front end is closed; the seat further includes two pin holes intersected with and in communication with each of the insertion holes; a position of each of the pin holes communicating with the corresponding insertion hole corresponds to a position of the corresponding notch.

15. The electrical connector as claimed in claim 14, further comprising two fixing pins for being inserted into the pin holes to pass through the notches.

* * * * *